United States Patent
Kim et al.

(10) Patent No.: US 7,825,583 B2
(45) Date of Patent: Nov. 2, 2010

(54) ORGANIC ELECTROLUMINESCENCE DISPLAY AND METHOD FOR MANUFACTURING THE SAME

(75) Inventors: Chang Nam Kim, Seoul (KR); Young Soo Han, Seoul (KR); Ho Nyun Lee, Gyeonggi-do (KR); Jin Won Chung, Seoul (KR); Hong Gyu Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 834 days.

(21) Appl. No.: 11/356,315

(22) Filed: Feb. 17, 2006

(65) Prior Publication Data

US 2006/0186805 A1 Aug. 24, 2006

(30) Foreign Application Priority Data

Feb. 22, 2005 (KR) .................. 10-2005-0014475

(51) Int. Cl.
*H05B 33/26* (2006.01)
(52) U.S. Cl. .................. 313/504; 313/512; 445/25
(58) Field of Classification Search ......... 313/498–512; 315/169.3; 345/36, 45, 76; 445/25
See application file for complete search history.

(56) References Cited

U.S. PATENT DOCUMENTS

2001/0026835 A1* 10/2001 Tanaka .................. 427/96
2005/0046335 A1* 3/2005 Chen et al. .................. 313/498
2005/0285520 A1* 12/2005 Cok .................. 313/512

FOREIGN PATENT DOCUMENTS

| JP | 2001-68266 A | 3/2001 |
| JP | 2002-50468 A | 2/2002 |
| JP | 2003-100447 A | 4/2003 |
| JP | 2003-272856 A | 9/2003 |
| JP | 2004-186045 A | 7/2004 |

OTHER PUBLICATIONS

Office Action issued Dec. 15, 2009 in corresponding Japanese Application No. 2006-041649.

* cited by examiner

*Primary Examiner*—Nimeshkumar D Patel
*Assistant Examiner*—Christopher M Raabe
(74) *Attorney, Agent, or Firm*—Morgan, Lewis & Bockius LLP

(57) ABSTRACT

An organic EL device and a method for manufacturing the same are disclosed. The organic EL device comprises a substrate having a first electrode arranged on an active region, at least one organic material layer formed on the first electrode, a second electrode formed on the organic material layer so as to extend to an inactive region of the substrate to allow heat of the device to be dissipated to an outside therethrough, and a seal-cup facing the second electrode while being sealingly connected with the second electrode at a seal line via a sealant. The organic EL device can effectively lower an interior temperature of the device while preventing degradation thereof, thereby remarkably increasing lifetime thereof, and enhance interface stability of the device, thereby remarkably suppressing degradation in characteristics of the device.

20 Claims, 7 Drawing Sheets

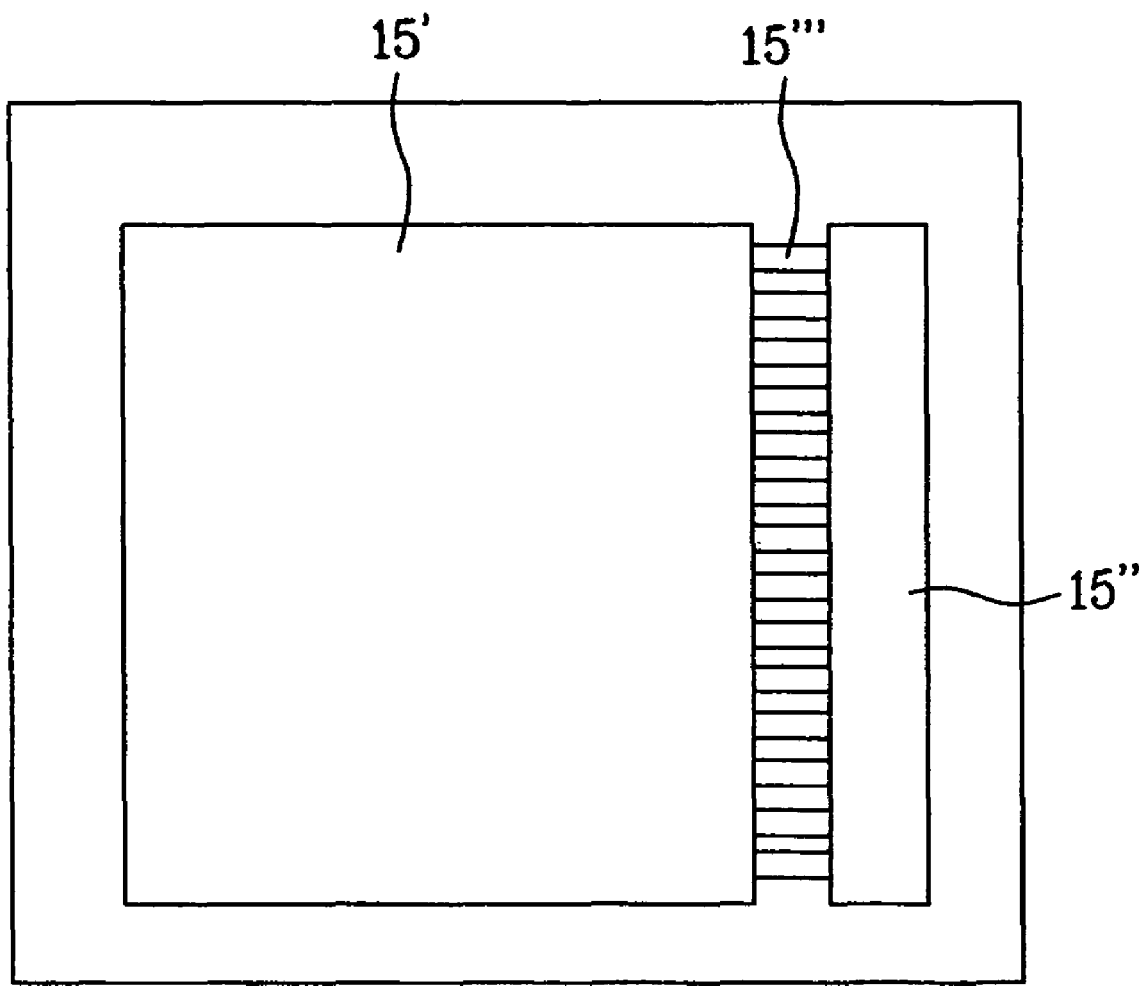

ORGANIC ELECTROLUMINESCENCE DISPLAY AND METHOD FOR MANUFACTURING THE SAME

This application claims the benefit of Korean Patent Application No. P2005-0014475, filed on Feb. 22, 2005, which is hereby incorporated by reference as if fully set forth herein.

BACKGROUND OF THE INVENTION

1. Field of the Invention

The present invention relates to an organic electroluminescence (EL) device, and more particularly, to an organic EL device, which has a heat dissipation structure to dissipate heat generated upon driving of the organic EL device and heat from a thin film transistor (TFT) on a substrate thereof.

2. Discussion of the Related Art

Generally, an organic EL device is a device which employs electroluminescence of an organic material, and has been spotlighted as a light emitting device capable of emitting light of high brightness while being driven by low voltage direct current, in which an organic light emitting layer or an organic hole transfer layer is stacked between an upper electrode and a lower electrode.

FIGS. 1A and 1B are a cross-sectional view and a plan view illustrating a conventional organic EL device, in particular, a conventional Active matrix bottom emission type organic EL device, respectively.

As shown in FIGS. 1A and 1B, the organic EL device comprises: a transparent substrate 10 which is composed of ITO and has a TFT 10' and a first electrode 10" formed thereon; at least one organic material layer 11 which comprises a hole injection layer, a hole transfer layer, a light emitting layer, a electron transfer layer, etc.; a second electrode 12 for injection of electrons and reflection of emitted light; a sealant 13 for sealing the components; and a seal-cup 14.

When + and − direct voltage is applied to the first electrode 10" and the second electrode 12 of the Active matrix bottom emission type organic EL device constructed as described above, holes injected from the first transparent electrode 10" transfer to the light emitting layer through the hole transfer layer of the organic material layer 11. In addition, electrons injected from the second electrode 12 transfer to the light emitting layer through the electron transfer layer. As a result, combination of the holes and the electrons occurs in the light emitting layer so that light is emitted through the transparent substrate made of ITO. In order to prevent cell shrinkage in the organic EL device due to moisture in atmosphere, the organic EL device is sealed by the sealant 13 and the seal-cup 14 in $N_2$ atmosphere, so that the moisture in the atmosphere is prevented from penetrating into the device. In most cases, the second electrode 12 is deposited inside a sealing line 13' which is on an active region, and used as a common electrode.

In such an active matrix bottom emission type organic EL device, heat generating regions can be generally divided into the TFT 10' which is formed on the substrate, and the organic material layer 11 of the organic EL device. At this time, the generated heat can be dissipated from the device to the outside thereof via heat conduction through a line for supplying electric power, and the glass substrate through which light is emitted, and via convection of gas existing between the second electrode 12 and the seal-cup 14 of the organic EL device.

However, the conventional organic EL device as described above has disadvantages in that an increase in width of the line results in reduction of an aperture ratio, in that the glass substrate causes ineffective heat transfer, and in that nitrogen occupying most portions of the gas is not conducive to dissipation of heat due to its significantly low heat conductivity. As such, the heat is not dissipated to the outside, and increases an interior temperature of the device, causing degradation in performance of the TFT, deposition of the organic material, and degradation in interface properties between the organic material and the electrode. As a result, the conventional organic EL device has problems of instability and reduced lifetime. In this point of view, there is a need in the art to provide an effective dissipation system in the organic EL device.

SUMMARY OF TEE INVENTION

Accordingly, the present invention is directed to an organic EL device and a method for manufacturing the same that substantially obviate one or more problems due to limitations and disadvantages of the related art.

It is an object of the present invention to provide an organic EL device, which has a heat dissipation structure to dissipate heat generated upon driving of the organic EL device and heat from a thin film transistor (TFT) on a substrate thereof, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic EL device, comprising: a substrate having a first electrode arranged on an active region; at least one organic material layer formed on the first electrode; a second electrode formed on the organic material layer so as to extend to the substrate which corresponds to an inactive region to allow heat of the device to be dissipated to an outside therethrough; and a seal-cup facing the second electrode while being sealingly connected with the second electrode at a seal line via a sealant.

In accordance with another aspect of the present invention, there is provided an organic EL device, comprising: a substrate having a first electrode arranged on an active region; at least one organic material layer formed on the first electrode; a second electrode formed on the organic material layer; a seal-cup facing the second electrode while being connected with the second electrode via a sealant; and a heat conductor connecting an edge of the second electrode inside a seal line with the seal-cup to dissipate heat of the device to an outside thereof.

In accordance with yet another aspect of the present invention, there is provided a method for manufacturing an organic EL device, comprising the steps of: forming a substrate having a first electrode formed thereon; forming at least one organic material layer on the first electrode such that holes and electrons are injected to the organic material layer, and then combined therein to emit light therethrough; forming a second electrode on the organic material layer to extend outside of a seal line; forming a seal-cup to face the second electrode; and applying a sealant to the second electrode on the seal line and to an edge of the seal-cup, followed by curing the sealant to seal the organic EL device.

In accordance with yet another aspect of the present invention, there is provided a method for manufacturing an organic EL device, comprising the steps of: forming a substrate having a first electrode formed thereon; forming a heat conductive layer on the substrate outside an active region of the substrate; forming at least one organic material layer on the first electrode such that holes and electrons are injected to the organic material layer, and then combined therein to emit light therethrough; forming a second electrode on the organic material layer within the active region; connecting the heat conductive layer outside the active region with the second electrode within the active region; and forming a seal-cup to face the second electrode, followed by connecting an edge of the seal-cup with the second electrode at a seal line using a sealant to seal the organic EL device.

In accordance with yet another aspect of the present invention, there is provided a method for manufacturing an organic EL device, comprising the steps of: forming a substrate having a first electrode formed thereon; forming at least one organic material layer on the first electrode such that holes and electrons are injected to the organic material layer, and then combined therein to emit light therethrough; forming a second electrode on the organic material layer within an active region; forming a seal-cup to face the second electrode, followed by forming a heat conductor connecting an edge of the second electrode and an edge of the seal-cup with an outer portion of the organic EL device; and connecting the heat conductor at the seal line with the seal-cup using a sealant to seal the organic EL device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 6 is a plan view illustrating a negative electrode formed using the shadow masks of FIGS. 5A and 5B.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
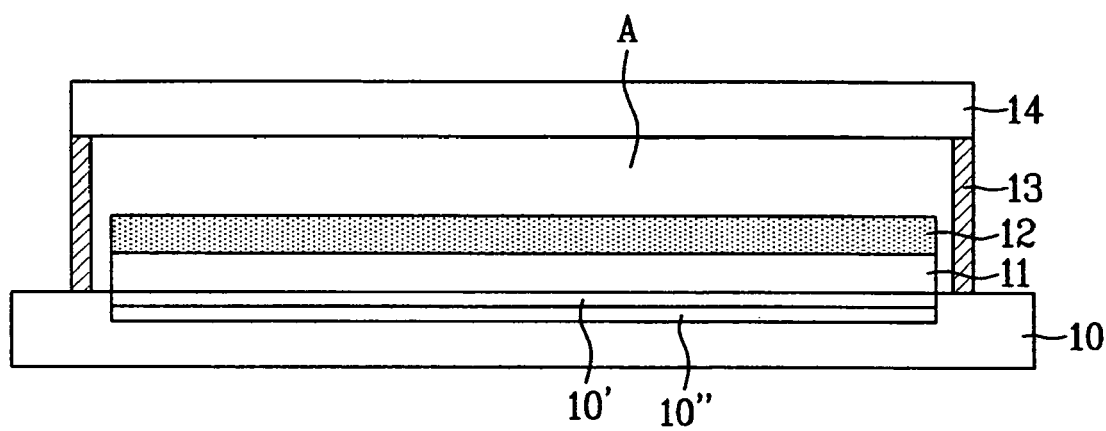
FIGS. 1A and 1B are a cross-sectional view and a plan view schematically illustrating a conventional organic EL device.
Figure 1B:
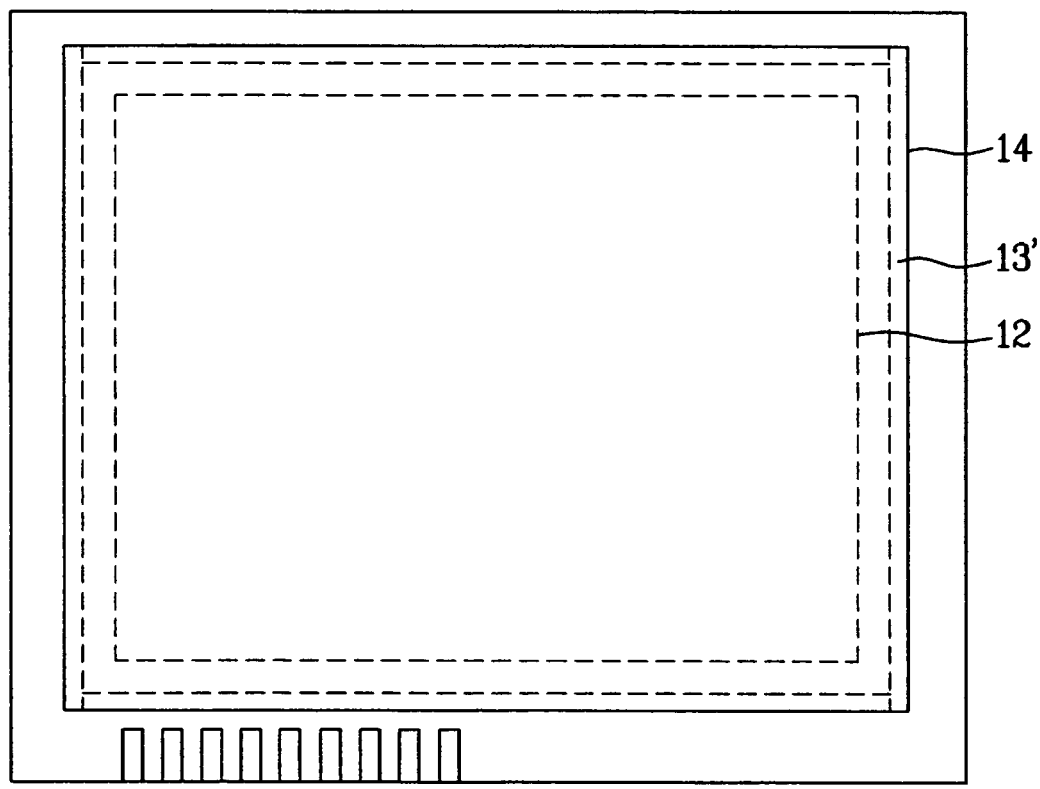
Figure 2A:
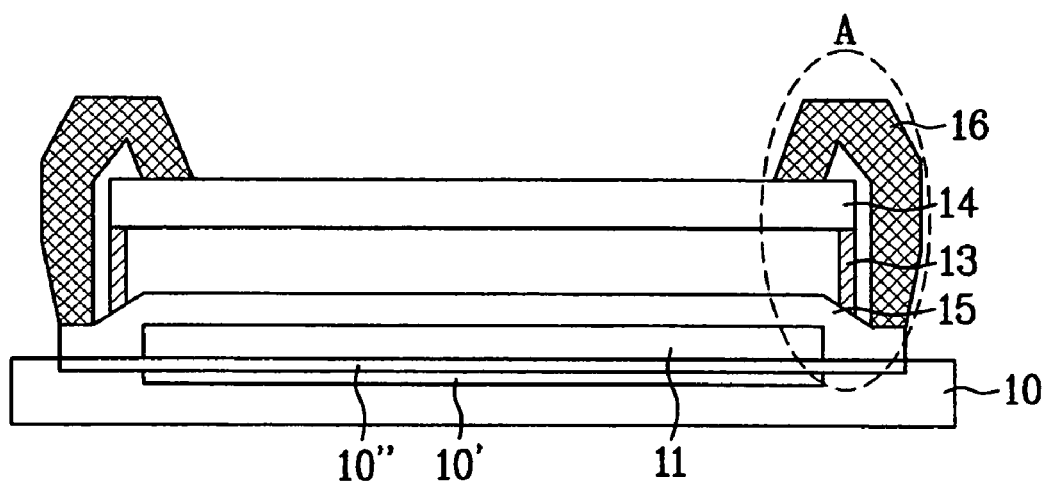
FIGS. 2A and 2B are a cross-sectional view and a plan view schematically illustrating an organic EL device in accordance with a first embodiment of the present invention.
Figure 2B:
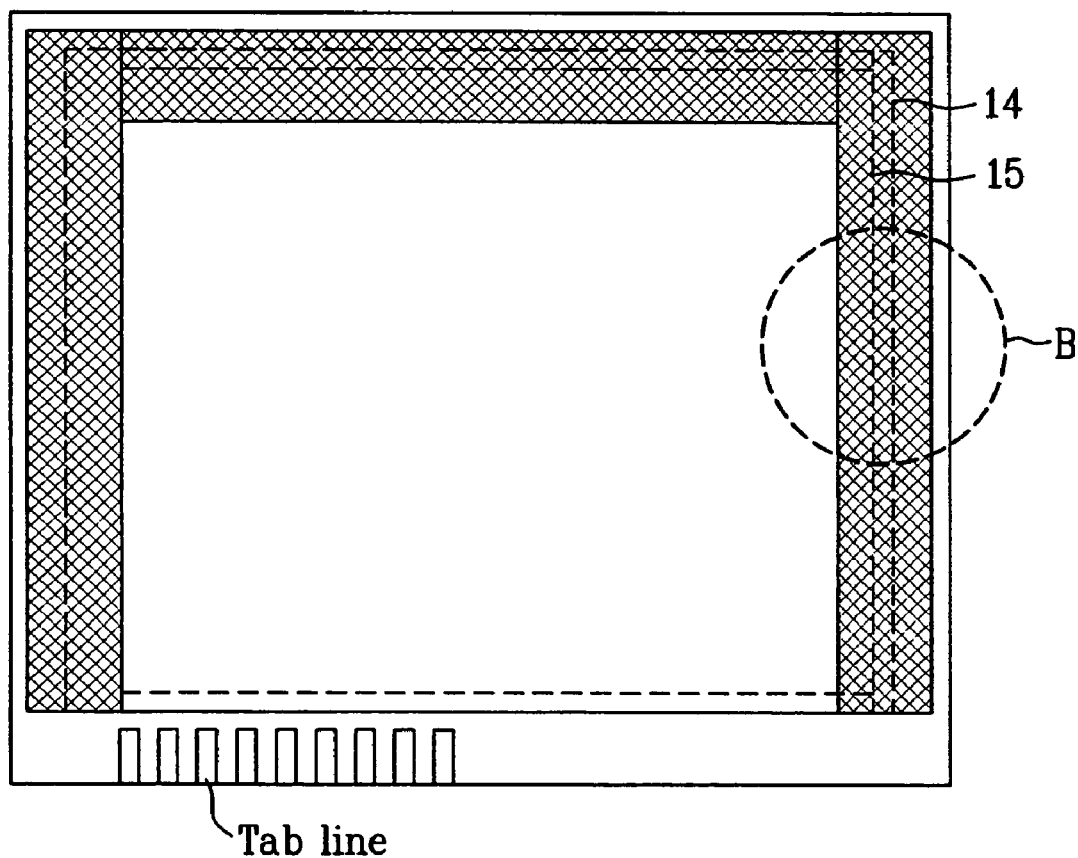

FIGS. 2A and 2B are a cross-sectional view and a plan view schematically illustrating an organic EL device in accordance with a first embodiment of the present invention.

Referring to FIGS. 2A and 2B, the organic EL device of the first embodiment comprises: a transparent substrate 10 which is composed of a transparent material such as ITO, and has a matrix-shaped TFT 10' and a first electrode 10" disposed on an active region thereon; at least one organic material layer 11 which is formed in the active region on the first electrode 10" such that holes and electrons are injected to the organic material layer 11, and then combined therein to emit light therethrough; a second electrode 15 formed over the organic material layer 11 and extending to an inactive region outside a seal line; a seal-cup 14 facing the second electrode 15; a sealant 13 formed to seal a periphery of the seal-cup 14 and the seal line of the second electrode 15; and a heat conductor 16 connecting the second electrode 15 of the inactive region outside the seal line with the seal-cup to dissipate heat of the organic EL device to an outside thereof.

The first electrode 10" is preferably transparent. As in the conventional organic EL device, the organic material layer 11 is composed of at least one organic material layer, and typically comprises a hole injection layer, a hole transfer layer, a light emitting layer, and an electron transfer layer.

After forming the active matrix substrate 10 comprising the TFT 10' and the first electrode 10", the organic material layer 11 is deposited thereon by the same process as that of the conventional method for manufacturing the organic EL device.

Figure 5A:
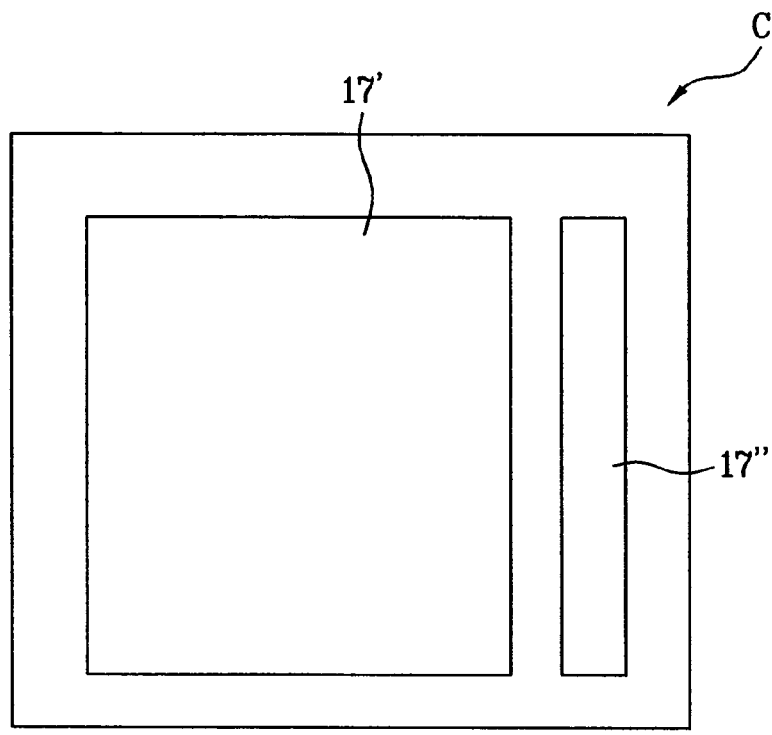
FIGS. 5A and 5B are views illustrating shadow masks.
Figure 5B:
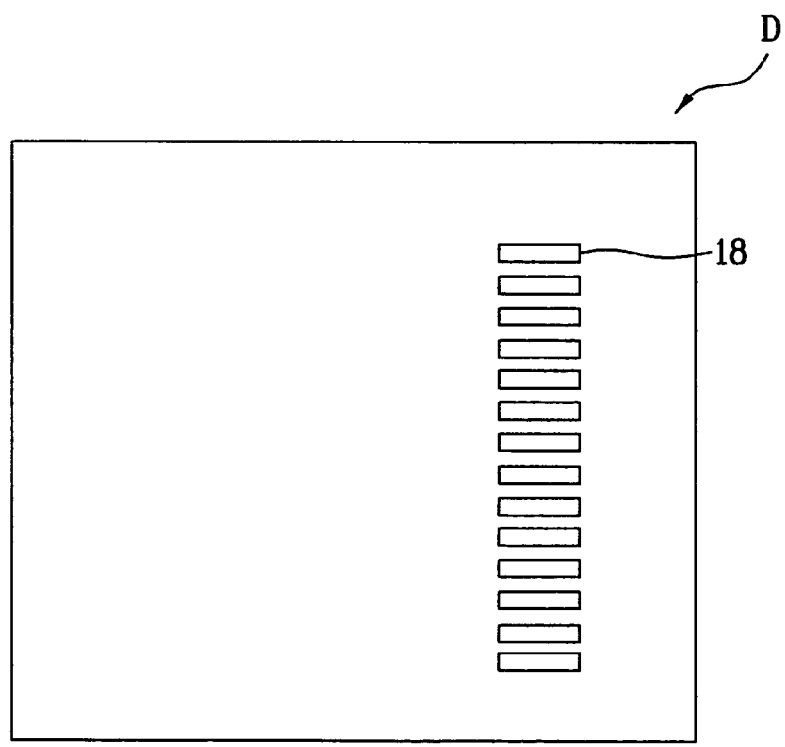

Then, the second electrode 15 is formed using shadow masks as shown in FIGS. 5A and 5B. Specifically, the second electrode 15 is formed using a shadow mask C through which a second electrode 17' corresponding to a wider region than a shadow mask generally used when forming an electrode, i.e., the active region, and a second electrode 17" corresponding to an inactive region outside the seal line are perforated, as shown in FIG. 5A, and a shadow mask D through which stripe-shaped openings 18 having a predetermined width are formed at predetermined spacing on a portion corresponding to the seal line, as shown in FIG. 5B. Then, as shown in FIG. 6, a stripe-shaped heat conductor 15''' is formed on the seal line to connect the second electrode 15" of the inactive region with the second electrode 15' of the active region, in which stripes of the heat conductor have a predetermined line-width, and are separated a predetermined distance from each other. Such a structure of the second electrode as described above is attributed to the fact that, if the seal-cup 14 is made of SUS, an opaque material, in a subsequent process, the sealant cannot be cured by radiating UV rays in a direction opposite to a light emitting direction from the device, that is, by radiating UV rays from above the seal-cup 14, and thus it is necessary for the a second electrode to have the structure for allowing the UV rays to reach the sealant. In addition, according to the present invention, the second electrode 15" of the inactive region is connected to the second electrode 15' of the active region using the shadow mask of FIG. 5B, which is formed with stripes arranged at a space of, for example, 100 μm and having a width of, for example, 100 μm as indicated by 15''' in FIG. 6. On the other hand, if the seal-cup is made of a transparent material such as glass, it is advantageous in terms of a manufacturing process to form the second electrodes 15' and 15" integrally. Although one side of the second electrode 15" on the inactive region is schematically illustrated in FIGS. 5A, 5B and 6, it is more preferable that the second electrode 15" of the inactive region be formed over an entire surface of the substrate excluding a TAB line as shown in FIG. 2B. In addition, since the second electrode 15' of the active region is provided with the organic material layer 11 therebelow, it is preferable that the second electrode 15' has a height taller than that of the second electrode 15" of the inactive region.

The second electrode 15 may be composed of a single layer, or two or more layers in order to effectively enhance thermal conductivity. As for a material for the second electrodes, a material having a high thermal conductivity is advantageous. For example, the second material may comprises 1) MgAl alloys, pure Al, or alloys formed by adding at least one of Nd, Ta, Nb, Mo, W, Ti, Si, B and Ni in a ratio of 5 at.% to Al, or 2) pure Cu, pure Ag, or alloys formed by adding at least one of Au, Cu, Nd, Al, Sn, Mg, Ti, Pt, Pd and Ni in a ratio of 5 at.% to Cu or Al.

Figure 4:
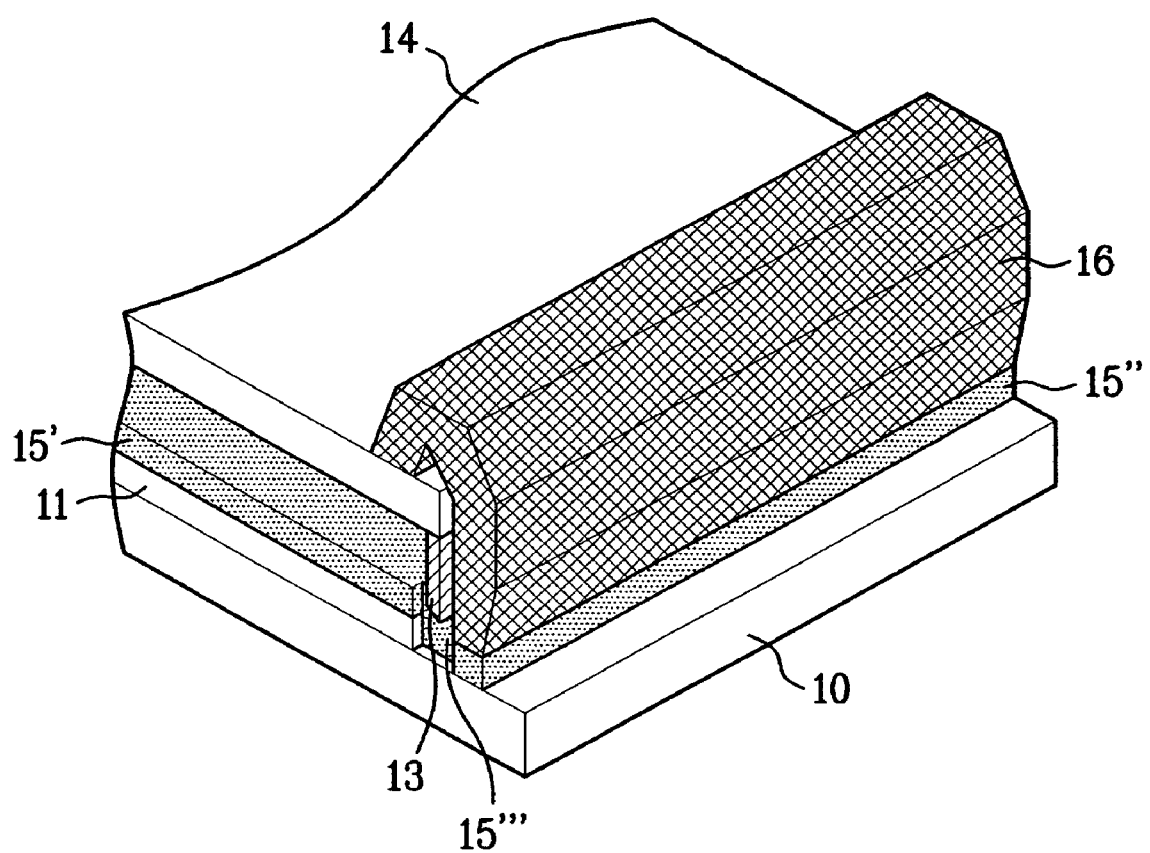
FIG. 4 is an enlarged view of Part A shown in FIG. 2A.

Then, as in the conventional method, the seal-cup 14 is formed of SUS, and a sealant material is applied to a periphery of the seal-cup 14 corresponding to the seal line of the second electrode 15, followed by radiating UV rays thereto, thereby sealing the organic EL device. Next, the second electrode 15" of the inactive region and the seal-cup 14 are connected by the heat conductor 16 (see FIG. 4). If the seal-cup 14 is made of a conductive material, it is more effective in terms of heat dissipation, but since the seal-cup 14 electrically contacts the second electrode exposed to the outside, the seal-cup may affect other components or vice versa. Accordingly, preferably, the second electrode 15" of the inactive region is insulated by applying an insulation tape thereto or by coating an insulation material thereon, thereby minimizing effect on the seal-cup due to electric contact between the second electrode and an outer component.

Figure 2C:
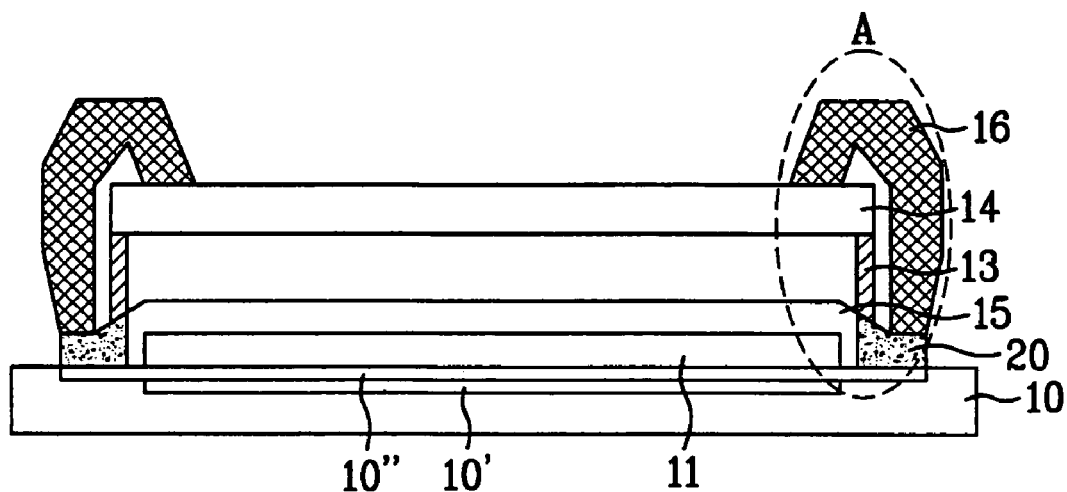
FIG. 2C is a cross-sectional view schematically illustrating an organic EL device in accordance with a second embodiment of the present invention.

FIG. 2C is a cross-sectional view schematically illustrating an organic EL device in accordance with a second embodiment of the present invention.

The organic EL device according to the second embodiment has the same construction as that of the first embodiment, excluding the structure that a second electrode 15 is formed only on an active region inside a seal line, and a heat conductive layer 20 is formed on the seal line to connect the second electrode 15 with the heat conductor 16.

Figure 2D:
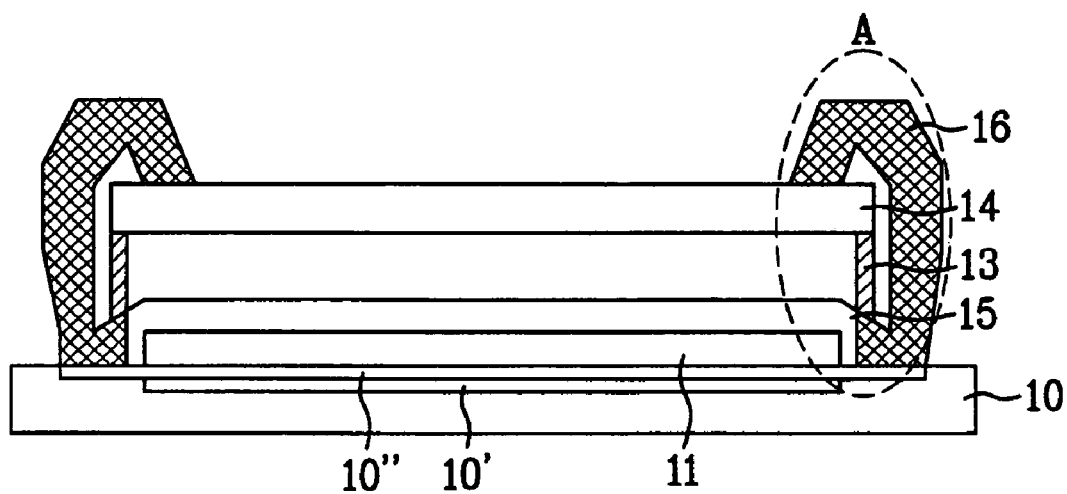
FIG. 2D is a cross-sectional view schematically illustrating an organic EL device in accordance with a third embodiment of the present invention.

FIG. 2D is a cross-sectional view schematically illustrating an organic EL device in accordance with a third embodiment of the present invention.

The organic EL device of the third embodiment has the same construction as that of the first embodiment, excluding the structure that a second electrode 15 is formed only on an active region inside a seal line, and a heat conductor 16 is formed to a region inside the seal line. As a result, the heat conductor 16 connects an edge of the second electrode inside the seal line with the seal-cup 14.

A method of manufacturing an organic EL device in accordance with the present invention will be described in detail as follows.

A method of manufacturing an organic EL device in according to a first embodiment of the present invention will be described as follows.

Figure 3:
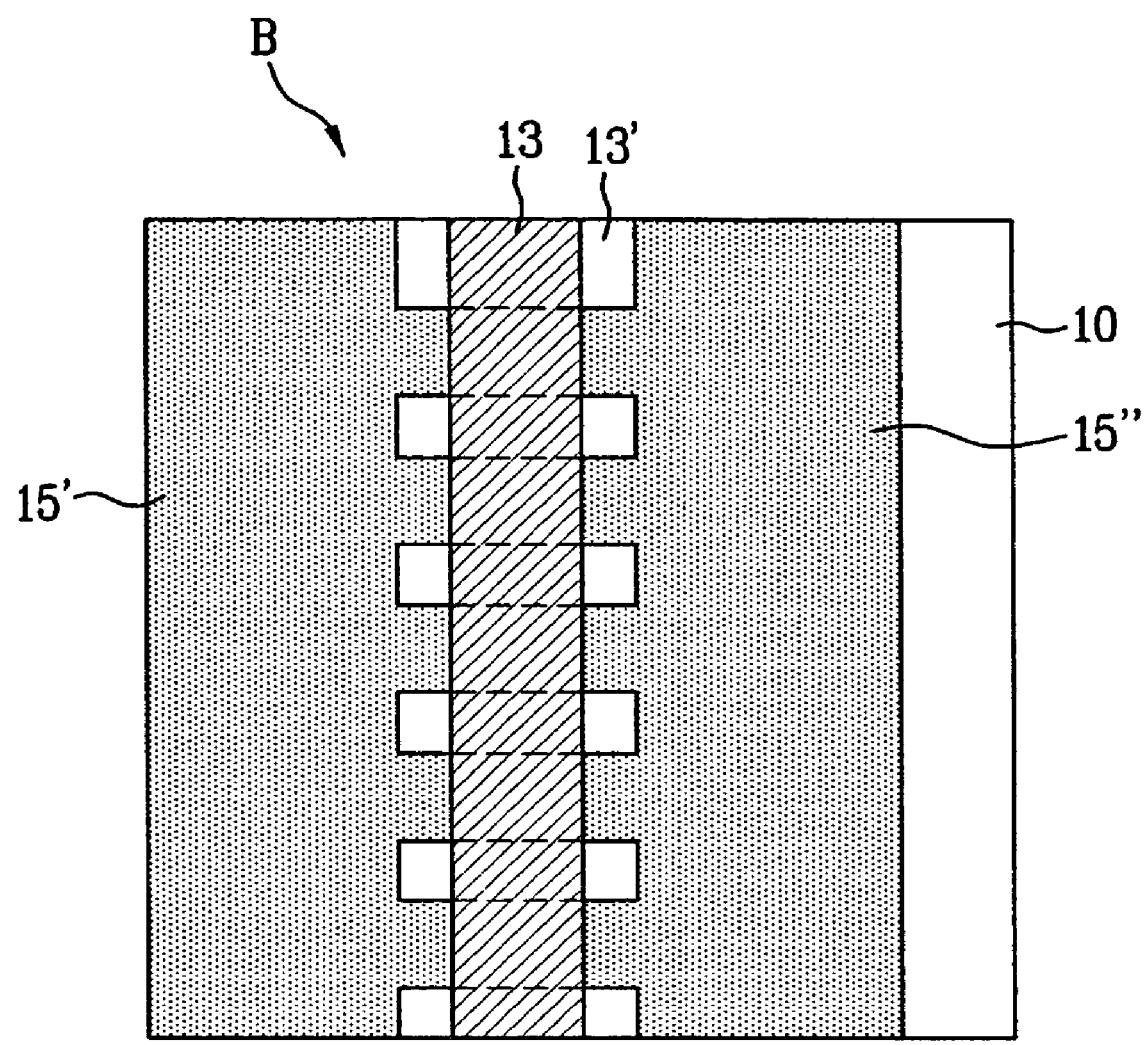
FIG. 3 is an enlarged view of Part B shown in FIG. 2B.

According to this embodiment, an organic EL device having a size of 1" is formed by depositing an organic material layer 11 and a second electrode 15 on a substrate 10 using a resistance heating method, in which the substrate 10 formed of ITO has a thickness of 150 nm, and comprises a TFT 10' and a first electrode 10" formed thereon. At this time, when depositing the second electrode, a second electrode 15" is formed to an inactive region outside a seal line 13' using shadow masks (see FIGS. 3, 5A and 5B) having wider areas than an active region. The second electrode 15 is shown as being formed on the active region indicated by 15' and the inactive region indicated by 15". The second electrode is made of Al, and has a thickness of 200 nm. After manufacturing the device, sealing is performed in $N_2$ atmosphere, and at this time, a seal-cup 14 is made of SUS. Here, the second electrode 15' of the active region is connected with the second electrode 15" exposed to the inactive region by a stripe-shaped connecting portion, that is, by using the shadow mask as shown in FIG. 5B, on a seal line for curing a sealant 13 (see FIG. 3), in which stripes of the connecting portion have a width of 10~500 μm, and are separated a distance of 10~500 μm from each other. This structure is attributed to the fact that the seal-cup 14 is made of opaque SUS. That is, this structure is provided for the purpose of allowing the sealant to be cured by UV rays radiated from below the second electrode, from which light is emitted, when sealing in the subsequent process as mentioned above. The connecting portion between the second electrode 15' of the active region and the second electrode 15" of the inactive region is not limited to the stripe shape, but may have other shapes. However, it is necessary for the connecting portion to have a space formed thereon so as to allow the UV light to be radiated therethrough.

The second electrode exposed to the inactive region of the outside is formed on four sides of the substrate excluding a region where the TAB line is formed, and heat is dissipated through the second electrode exposed to the outside, so that temperature is reduced during driving of the device. In order to remove any effect between the second electrode exposed to the outside and electric components outside the device, an insulation material is coated on the second electrode exposed to the outside and the SUS-cup. As for a coating method, it is preferable to attach an insulation tape thereto. After attaching a polarization film to the organic EL device, the organic EL device was operated with white light of 200 cd/m² at 0.31 and 0.33 on the chromaticity diagram. As a result, compared with 52° C. of the conventional organic EL device (in the case where the second electrode exists only on an active region of the seal line), the organic EL device of the first embodiment was reduced in temperature to 48° C., and it was presumed that the interior temperature of the device would be further reduced. In addition, it was confirmed that the organic EL device having the second electrode exposed to an outer portion of the seal line had its lifetime increased 15% or more than that of the conventional organic ED device.

A method of manufacturing an organic EL device according to a second embodiment will be described as follows.

The method of the second embodiment has the same steps as those of the first embodiment except that, after preceding steps, a heat conductor 16 is formed using a silver paste, which thermally connects a seal-cup 14 with a second electrode 15" of an inactive region outside a seal line as shown in FIG. 2A. After attaching a polarization film to the organic EL device formed as described above, the organic EL device was operated with white light of 200 cd/m² at 0.31 and 0.33 on the chromaticity diagram. As a result, compared with 52° C. of the conventional organic EL device, the organic EL device of the second embodiment was reduced in temperature to 42° C., and it was presumed that the interior temperature of the device would be further reduced. Further, it was confirmed that, as the device was enhanced in stability by allowing heat to be effectively dissipated from the device, the organic EL device of the second embodiment had its lifetime increased 70% or more of that of the conventional organic ED device.

A method of manufacturing an organic EL device according to a third embodiment will be described as follows.

The method of the third embodiment has the same steps as those of the second embodiment. As an exception, the seal-cup 14 is made of a glass, a transparent insulator instead of SUS, an opaque metal, a second electrode of a seal line is integrally formed with a second electrode 15" of an inactive region outside the seal line without the stripe-shaped connecting portion, and an insulation tape is attached to a portion of the second electrode 15" to which a silver paste is applied.

The reason for integrally forming the second electrode on the seal line instead of using the stripe-shaped connecting portion is that, since the seal-cup is made of the transparent glass, it is possible to cure a sealant by radiating UV rays from a side opposite to a side through which light is emitted, that is, from above a seal-cup without the stripe-shaped connecting portion which has a complicated structure. In addition, since the seal-cup itself is made of the glass as an insulator whereas the second electrode is an electrical conductor, it is not necessary to additionally attach the insulation tape to a portion to which a silver paste of the seal-cup is applied, and the insulation tape is attached only to the portion of the second electrode 15" to which the silver paste is applied.

After attaching a polarization film to the organic EL device formed by the method of the third embodiment as described above, the organic EL device was operated with white light of 200 cd/m$^2$ at 0.31 and 0.33 on the chromaticity diagram. As a result, compared with 52° C. of the conventional organic EL device, the organic EL device of the second embodiment was reduced in temperature to 46° C., and it was presumed that the interior temperature of the device would be further reduced. In addition, it was confirmed that, as the device was enhanced in stability by allowing heat to be effectively dissipated from the device having the second electrode exposed to the outside, the organic EL device of the third embodiment had its lifetime increased 40% or more than that of the conventional organic ED device.

A method of manufacturing an organic EL device according to a forth embodiment will be described as follows.

The method of the forth embodiment has substantially the same steps as those of the second embodiment. As an exception, in the method according to the fourth embodiment, the second electrode is deposited in a multiple layers rather than a single Al layer in order to enhance heat conductivity in such a way that an Al layer is first deposited to have a thickness of 100 nm using a shadow mask, and then Cu is deposited to have a thickness of 200 nm on the Al layer.

After attaching a polarization film to the organic EL device formed by the method of the forth embodiment as described above, the organic EL device was operated with white light of 200 cd/m$^2$ at 0.31 and 0.33 on the chromaticity diagram. As a result, compared with 52° C. of the conventional organic EL device, the organic EL device of the forth embodiment was reduced in temperature to 41° C., and it was presumed that the interior temperature of the device would be further reduced. In addition, it was confirmed that, as the device was enhanced in stability by allowing heat to be effectively dissipated from the device via the second electrode exposed to the outside and the structure of connecting the second electrode exposed to the outside with the seal-cup by use of the heat conductor, the organic EL device of the forth embodiment had its lifetime increased 75% or more than that of the conventional organic ED device.

A method of manufacturing an organic EL device according to a fifth embodiment will be described as follows.

The method of the fifth embodiment has substantially the same steps as those of the first embodiment, except that the method of the fifth embodiment further comprises a step of thermally connecting a second electrode 15" of an inactive region outside a seal line with a seal-cup 14 made of SUS by means of an Al tape. After attaching a polarization film to the organic EL device formed by the method of the forth embodiment as described above, the organic EL device was operated with white light of 200 cd/m$^2$ at 0.31 and 0.33 on the chromaticity diagram. As a result, compared with 52° C. of the conventional organic EL device, the organic EL device of the fifth embodiment was reduced in temperature to 42° C., and it was presumed that the interior temperature of the device would be further reduced. In addition, it was confirmed that, as the device of the fifth embodiment was enhanced in stability by allowing heat to be effectively dissipated from the device, the organic EL device of the fifth embodiment had its lifetime increased 70% or more than that of the conventional organic ED device.

Although the description is given for the active matrix bottom emission type organic EL device with the first electrode serving as a positive electrode and the second electrode serving as a negative electrode, the present invention can be applied to a Passive Matrix Bottom Emission type organic EL device. In other words, for the Passive Matrix Bottom Emission type organic EL device, the first electrode may be formed as a positive electrode, and the second electrode may be formed as a negative electrode such that the first electrode emits electrons, and the second electrode emits holes.

As apparent from the above description, the organic EL device according to the present invention can effectively dissipate heat generated upon driving of the organic EL device and heat from the TFT on the substrate thereof, lowering the interior temperature of the device compared with a conventional organic EL device, prevents degradation of the organic EL device, remarkably increasing lifetime thereof, and enhances interface stability of the device, remarkably suppressing degradation in characteristics of the device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic EL device, comprising:
   a substrate having a first electrode arranged on an active region;
   at least one organic material layer formed on the first electrode;
   a second electrode formed on the organic material layer so as to extend to an inactive region of the substrate to allow heat of the device to be dissipated to an outside therethrough;
   a seal-cup facing the second electrode while being sealingly connected with the second electrode at a seal line via a sealant; and
   a heat conductor connecting an edge of the second electrode on the inactive region with the seal-cup and located on an outside of the sealant, and
   wherein the second electrode of the inactive region is formed on four sides of the substrate excluding a region where a TAB line is formed.

2. The organic EL device according to claim 1, wherein the substrate is a transparent substrate and further comprises a TFT arranged in matrix on the active region, and the second electrode serves to inject electrons into the device and to reflect light.

3. The organic EL device according to claim 1, wherein the second electrode is composed of any one of MgAl alloys, pure Al, and alloys formed by adding at least one of Nd, Ta, Nb, Mo, W, Ti, Si, B and Ni in a ratio of 5 at. % to Al.

4. The organic EL device according to claim 1, wherein the second electrode is composed of any one of pure Cu, pure Ag, and alloys formed by adding at least one of Au, Cu, Nd, Al, Sn, Mg, Ti, Pt, Pd and Ni in a ratio of 5 at. % to Cu or Al.

5. The organic EL device according to claim 1, wherein the second electrode extends a length of 1~10 mm outwardly from the seal line.

6. The organic EL device according to claim 1, wherein the second electrode is higher on the active region than on the inactive region.

7. The organic EL device according to claim 2, wherein the seal-cup is made of SUS being an opaque material, and the second electrode on the seal line comprises a stripe-shaped metallic film.

8. The organic EL device according to claim 7, wherein stripes of the metallic film have a line width of 10~500 μm, and are separated by a distance of 10~500 μm from each other.

9. The organic EL device according to claim 1, wherein the heat conductor is any one of a silver paste, a heat conductive tape, and a thermal grease.

10. The organic EL device according to claim 1, wherein the seal-cup comprises a conductive material, the heat conductor comprises an insulation material, and the second electrode of the inactive region is coated with the insulation material.

11. The organic EL device according to claim 1, wherein the second electrode comprises at least two metallic layers.

12. The organic EL device according to claim 11, wherein the second electrode has a double-layer structure formed by stacking an Al layer and a Cu layer.

13. A method for manufacturing an organic EL device, comprising the steps of:
    forming a substrate having a first electrode formed thereon;
    forming at least one organic material layer on the first electrode such that holes and electrons are injected to the organic material layer, and then combined therein to emit light therethrough;
    forming a second electrode on the organic material layer to extend outside of a seal line;
    forming a seal-cup to face the second electrode;
    applying a sealant to the second electrode on the seal line and to an edge of the seal-cup, followed by curing the sealant to seal the organic EL device; and
    forming a heat conductor connecting an edge of the second electrode outside the seal line with the seal-cup and located on an outside of the sealant, and
    wherein the second electrode outside of the seal line is formed on four sides of the substrate excluding a region where a TAB line is formed.

14. The method according to claim 13, wherein the substrate is a transparent substrate and further comprises a TFT arranged in matrix on the active region, and the second electrode serves to inject the electrons into the device and to reflect light.

15. The method according to claim 13, wherein the second electrode is formed using a shadow mask having a size 1~10 mm or greater than that of the active region of the organic EL device.

16. The method according to claim 14, wherein, when the seal-cup is opaque, the second electrode on the seal line is formed of a stripe-shaped metallic film so as to allow UV rays to reach the sealant.

17. The method according to claim 13, wherein the seal-cup is made of SUS being an opaque material, and the second electrode and the heat conductive layer on the seal line are formed of a stripe-shaped metallic film so as to allow UV rays to reach the sealant.

18. The method according to claim 17, wherein stripes of the metallic film have a line width of 10~500 μm, and are separated by a distance of 10~500 μm from each other.

19. The method according to claim 13, wherein the second electrode is composed of any one of MgAg alloy, pure Al, Pure Cu, pure Ag, alloy formed by adding at least one of Nd, Ta, Nb, Mo, W, Ti, Si, B and Ni in a ratio of 5 at. % to Al, and alloy formed by adding at least one of Au, Cu, Nd, Al, Sn, Mg, Ti, Pt, Pd and Ni in a ratio of 5 at. % to Cu or Al.

20. The method according to any one of claim 13, wherein the heat conductor is any one of a silver paste, a heat conductive tape, and a thermal grease.

* * * * *